United States Patent [19]

Ishida

[11] Patent Number: 5,326,988
[45] Date of Patent: Jul. 5, 1994

[54] SUPERCONDUCTING SWITCHING DEVICE AND METHOD OF MANUFACTURING SAME

[75] Inventor: Ichiro Ishida, Tokyo, Japan

[73] Assignee: NEC Corporation, Tokyo, Japan

[21] Appl. No.: 999,656

[22] Filed: Dec. 29, 1992

Related U.S. Application Data

[63] Continuation of Ser. No. 686,151, Apr. 16, 1991, abandoned.

[30] Foreign Application Priority Data

Apr. 16, 1990 [JP] Japan .................................. 2-99669

[51] Int. Cl.$^5$ ................... H01L 39/22; H01L 27/12; H01L 45/00
[52] U.S. Cl. ....................................... 257/39; 257/35; 257/288; 257/289; 257/661
[58] Field of Search ................. 357/5; 257/39, 288, 257/289, 661, 35

[56] References Cited

FOREIGN PATENT DOCUMENTS

| | | | |
|---|---|---|---|
| 0257474 | 3/1988 | European Pat. Off. | 257/39 |
| 0324044 | 7/1989 | European Pat. Off. | 357/5 |
| 63-287078 | 11/1988 | Japan | 257/39 |
| 1-64379 | 3/1989 | Japan | 257/39 |
| 1-170080 | 7/1989 | Japan . | |
| 2-119188 | 5/1990 | Japan | 257/39 |

OTHER PUBLICATIONS

Fang et al "Superconducting FET" *IBM Tech Discl. Bull.* vol. 19 No. 4, pp. 1461-1462. Sep. 1976.
Ivanov et al "Three Terminal Josephson Junction with a Semiconductor Accumulation Layer" *Jap. J. Appl. Phys* vol. 26 Suppl 26-3 (1987).
Nishino et al. "Study of Si-Coupled Superconducting Field-Effect Transistor by Tunneling Spectroscopy" IEEE vol. 8 (1988) pp. 286-289.
Sugahara et al. "Experiment of FET with a Channel Made of NBN Granular Thin Film" IEEE Trans. on Magnetics vol. 25 No. 2. Mar. 1989.
"0.1-$\mu$m Gate-Length Superconducting FET", Nishino, et al., IEEE Electron Device Letters, vol. 10, No. 2, Feb. 1989, pp. 61-63.

*Primary Examiner*—Ngan Ngo
*Attorney, Agent, or Firm*—Burns, Doane, Swecker & Mathis

[57] ABSTRACT

A superconducting device including first and second trenches formed on a principal surface of a semiconductor substrate, separated from each other, and first and second superconductor electrodes filled in the first and second trenches and planarized to have a surface coplanar with the principal surface of the semiconductor substrate. The first and second superconductor electrodes form a separation zone which is defined by opposing sides of the first and second superconductor electrodes. An insulating layer is formed to cover a portion of the first superconductor electrode, the separation zone and a portion of the second superconductor electrode, and a gate electrode is formed on the insulating layer so as to be positioned above at least the separation zone. The above mentioned superconducting device can be formed by forming first and second trenches on a principal surface of a semiconductor substrate separate from each other, and depositing a superconductor layer so as to cover a whole of the principal surface of the semiconductor substrate. A resin layer is deposited on the whole of the principal surface of the semiconductor substrate, and etch-back is performed to completely remove the deposited resin layer and also to remove the deposited superconductor layer from a surface excluding the first and second trenches, so that the superconductor layer remaining in the first and second trenches respectively form first and second superconductor electrodes planarized to have a surface coplanar with the principal surface of the semiconductor substrate. An insulating layer and a gate electrode are formed to cover at least a separation zone between the first and second trenches.

5 Claims, 2 Drawing Sheets

SUPERCONDUCTING SWITCHING DEVICE AND METHOD OF MANUFACTURING SAME

This application is a continuation of application Ser. No. 07/686,151, filed Apr. 16, 1991 now abandoned.

BACKGROUND OF THE INVENTION

1. Field of the Invention

The present invention relates to a superconducting device composed of a superconductor material and a semiconductor material and a method for manufacturing the same.

2. Description of Related Art

One example of a conventional superconducting device composed of a superconductor material and a semiconductor material has been proposed by T. Nishino et. al. in IEEE Transactions and Electron Devices Letters, Vol. 10 February 1989, page 61. The proposed superconducting device has been such that a switching operation is realized in a superconduction region (a also known as a spreading or permeating length, when spreading or penetrating into the semiconductor material from the superconductor material is realized. To this end, two superconductors are separated from each other by a distance corresponding to the above mentioned penetration length, and a space between the two superconductors is filled with a semiconductor, a carrier concentration of which is controlled by suitable means.

The carrier concentration in the semiconductor can be controlled by an electric field effect which can be realized by applying an electric field to the semiconductor, or by utilizing a PN junction. In both of these methods, a gate electrode can be provided on a semiconductor substrate surface on which superconductor electrodes are formed, or on a surface of semiconductor substrate opposite to the surface on which the superconductor electrodes are formed.

In the case of the conventional superconducting device, the penetration length of supeconduction condition is not greater than 0.1 $\mu$m when a conventional semiconductor material is used. Therefore, when the gate electrode is provided on the same surface as the semiconductor substrate surface on which the superconductor electrodes are formed, it is necessary to form the gate electrode in a space of about 0.1 $\mu$m between the superconductor electrodes. This is very difficult using current fine patterning technology.

If the gate electrode is provided on the surface of semiconductor substrate opposite to the surface on which the superconductor electrodes are formed, the planar structure required for integration of elements cannot be realized.

SUMMARY OF THE INVENTION

Accordingly, it is an object of the present invention to provide a superconducting device which includes a superconductor material and a semiconductor material and which overcomes the above mentioned defect of the conventional device.

Another object of the present invention is to provide a superconducting device which includes a superconductor material and a semiconductor material and which has a planar structure that can be easily realized using current fine patterning technology.

The above and other objects of the present invention are achieved in accordance with the present invention by a superconducting device comprising a semiconductor substrate, first and-second trenches formed on a principal surface of the semiconductor substrate separated from each other, first and second superconductor electrodes filled in the first and second trenches, the first and second superconductor electrodes forming a separation zone which is defined by opposing sides of the first and second superconductor electrodes and which has a length corresponding to a distance between opposing upper side edges of the first and second trenches, and a control electrode formed in proximity of the separation zone so as to control a carrier concentration in the separation zone.

Preferably, an insulating layer is formed on the semiconductor substrate to cover a portion of the first superconductor electrode, the separation zone and a portion of the second superconductor electrode, and the control electrode constitutes a gate electrode formed on the insulating layer so as to be positioned above at least the separation zone.

In addition, a superconducting device as claimed in claim 1 is formed wherein the first and second superconductor electrodes are planarized to have a surface coplanar with the principal surface of the semiconductor substrate.

According to another aspect of the present invention, there is provided method for manufacturing a superconducting device including a superconductor material and a semiconductor material, comprising the steps of forming first and second trenches on a principal surface of a semiconductor substrate separate from each other, filling a superconductor into the first and second trenches and forming a control electrode in proximity of a portion of the semiconductor substrate between the first and second trenches.

Preferably, the method may further include the steps of depositing a superconductor layer so as to cover the whole of the principal surface of the semiconductor substrate including the first and second trenches so that first and second trenches are filled with the deposited superconductor layer. The method for this involves a resin layer on the whole of the principal surface of the semiconductor substrate, etching the deposited resin layer and the deposited superconductor layer so as to completely remove the deposited resin layer and also to remove the deposited superconductor layer from a surface excluding the first and second trenches, so that the superconductor layer remaining in the first and second trenches respectively form first and second superconductor electrodes having a planarized surface coplanar with the principal surface of the semiconductor substrate, the method also involves forming an insulating layer to cover a portion of the first superconductor electrode, a portion of the second superconductor electrode and a separation zone between the first and second trenches, and forming a gate electrode on the insulating layer so as to be positioned above at least the separation zone.

In the above mentioned superconducting device in accordance with the present invention, the first and second trenches formed on a principal surface of the semiconductor substrate are filled with first and second superconductor electrodes planarized to have a surface coplanar with the principal surface of the semiconductor substrate. The first and second trenches have a predetermined separation distance between opposing upper side edges of the first and second trenches. Therefore, a portion of the semiconductor substrate between the first and second trenches forms a switching region, whose surface defines the separation zone. The gate electrode is formed on an area including the separation zone, through the intermediary of the insulating layer. With this arrangement, the length of the switching region, namely the separation zone is set to a value (on the order of 0.1 μm) which makes possible the interconnection or disconnection of the first and second superconductor electrodes by a penetration or spreading of a superconducting condition from the first and second superconductor electrodes.

Thus, a carrier concentration of the semiconductor substrate portion between the first and second superconductor electrodes can be modified by applying an electric voltage to the gate electrode. Therefore, a superconducting condition between the first and second superconductor electrodes can be controlled, thereby, to selectively generate either a first condition in which the first and second superconductor electrodes are electrically coupled to each other or a second condition in which the first and second superconductor electrodes are electrically disconnected from each other.

In the above mentioned structure of the superconductor device in accordance with the present invention, the space or distance between the first and second superconductor electrodes can be set independently of the first superconductor electrode. In other words, the length of the region generating or suppressing the superconducting condition under the electric field effect can be set independently of the first superconductor electrode. In addition, since the gate electrode is not required to have the same length as the space between the first and second superconductor electrodes, the planar structure can be easily realized without using the fine patterning technology for forming the gate electrode.

In the conventional superconducting device, the shape of the switching region was two-dimensional. In the superconducting device in accordance with the present invention, a pair of opposing surfaces are formed by the first and second superconducting electrodes. Therefore, the switching region is three-dimensionally defined.

On the other hand, in the method in accordance with the present invention for manufacturing a superconducting device, the first and second trenches are formed in the semiconductor substrate. The space or distance between the first and second trenches is determined by one photolithography process. Therefore, instability in positional relation between the first and second trenches including misalignment and others can be completely avoided. As a result, a positional relation between the first and second superconductor electrodes is also determined by the photolithography process for forming the first and second trenches, and therefore, a tolerance in the fine patterning technology can be increased.

In addition, the first and second superconductor electrodes are planarized to have a surface coplanar with the principal surface of the semiconductor substrate. Therefore, the first and second superconductor electrodes can be wired at the same surface side as that of a wiring connected to the gate electrode which is formed on the principal surface of the semiconductor substrate through the intermediary of the insulating layer. It is very suitable to the planar structure.

The above and other objects, features and advantages of the present invention will be apparent from the following description of preferred embodiments of the invention with reference to the accompanying drawings.

DESCRIPTION OF THE PREFERRED EMBODIMENTS

Figure 1:
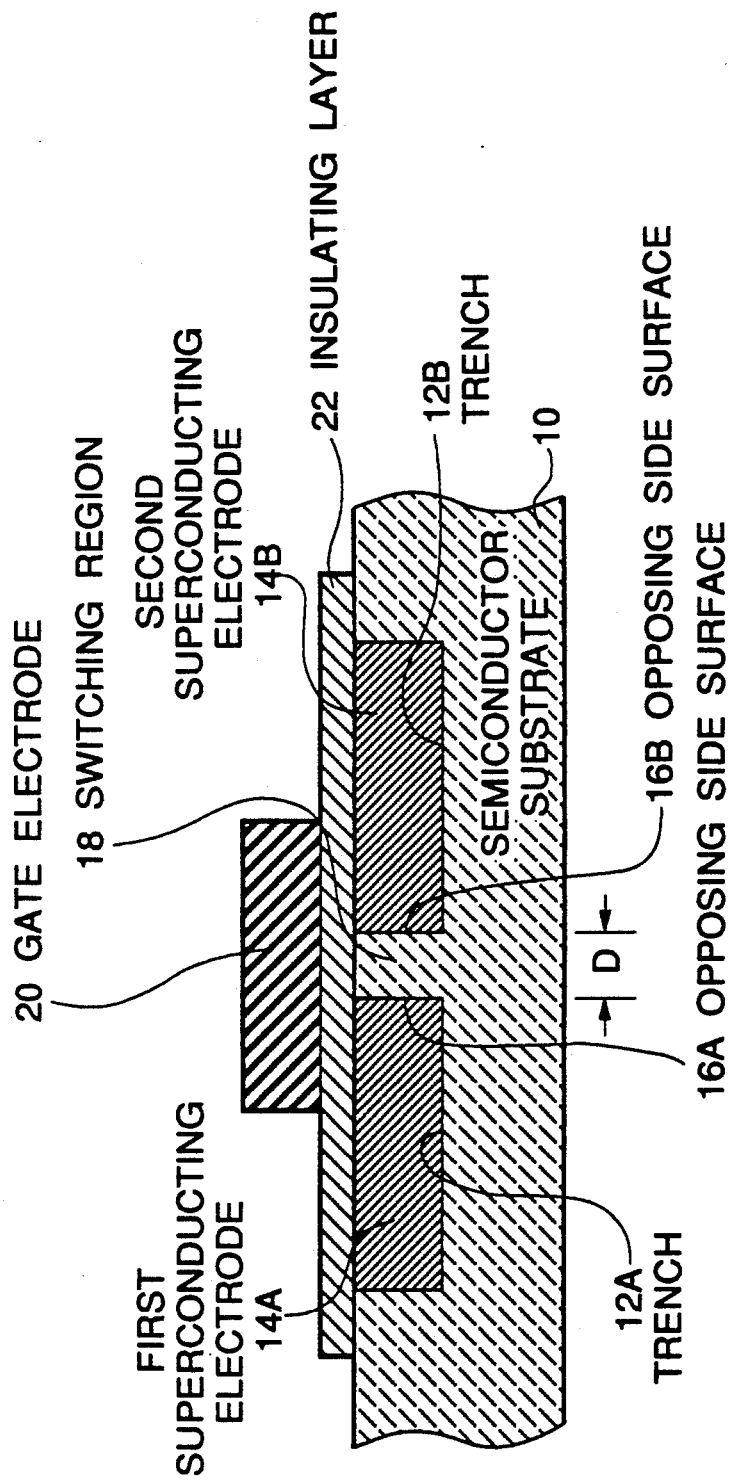
FIG. 1 is a diagrammatic sectional view of one embodiment of the superconducting device in accordance with the present invention.

Referring to FIG. 1, there is shown a diagrammatic sectional view of one embodiment of the superconducting device in accordance with the present invention.

The shown device includes a semiconductor substrate 10 formed of silicon doped with arsenic at a concentration of $5 \times 10^{25} m^{-3}$. A pair of trenches 12A and 12B having a depth of 200 nm are formed on a predetermined area of a principal surface of the semiconductor substrate 10. These trenches 12A and 12B are filled with a layer of superconductor material for example niobium having the same thickness as the depth of the trenches, so that first and second superconducting electrodes 14A and 14B are formed.

Each of the trenches 12A and 12B has a size of 3 μm × 3 μm, and a space or distance D between opposing side surfaces 16A and 16B of the trenches 12A and 12B is set to be 0.1 μm. A region 18 of the semiconductor substrate 10 sandwiched between that first and second superconducting electrodes 14A and 14B forms a switching region, which has a volume of 0.1 μm × 0.2 μm × 3 μm. In addition, a surface area of the semiconductor substrate 10 in the switching region 18 forms a separation zone, which has an area of 0.1 μm × 3 μm.

On the separation zone 18, a gate electrode 20 formed of for example aluminum is located with the intermediary of an insulating layer 22 formed of a silicon dioxide film having a thickness of 10 nm.

Now, a process for manufacturing the above mentioned superconducting device will be explained with reference to FIGS. 2A to 2E.

Figure 2A:
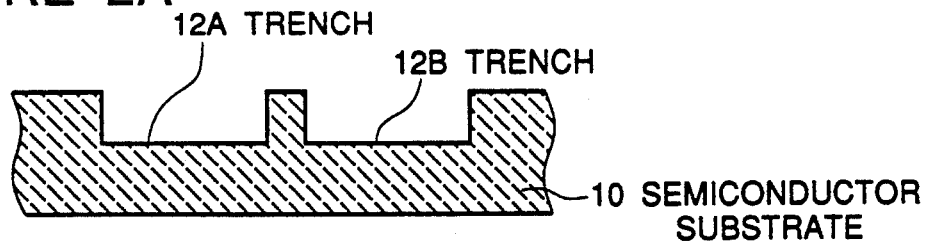
FIGS. 2A to 2E are diagrammatic sectional views illustrating one embodiment of the superconducting device manufacturing method in accordance with the present invention.

First, as shown in FIG. 2A, a pair of trenches 12A and 12B having a depth of 200 nm and a size of 3 μm × 3 μm are formed on a predetermined area of a semiconductor substrate 10 formed of silicon doped with arsenic at a concentration of $5 \times 10^{25} m^{-3}$, so as to have a space of 0.1 μm between the trenches 12A and 12B, by means of ion milling using a patterned photoresist (not shown) as a mask. These trenches 12A and 12B can be formed by other methods. For example, the trenches can be formed by a RIE (reactive ion etching) using a patterned photoresist (not shown) as a mask. In addition, the photoresist (not shown) is patterned by an EB (electron beam) exposure technology or an X-ray exposure technology.

In the shown embodiment, since the pair of trenches 12A and 12B have the same depth, the pair of trenches 12A and 12B can be formed by only one photolithography process. In addition, the positional relation between the pair of trenches 12A and 12B and hence the length of the switching region and the separation zone are defined by the photolithography process for forming the pair of trenches 12A and 12B.

Figure 2B:
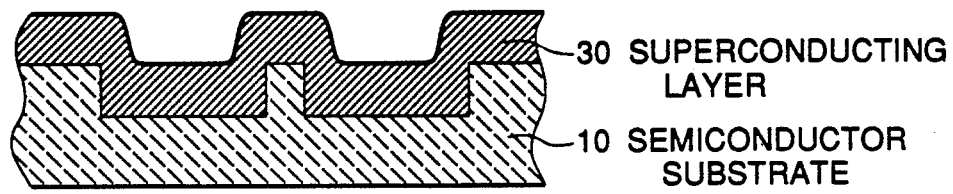
Figure 2C:
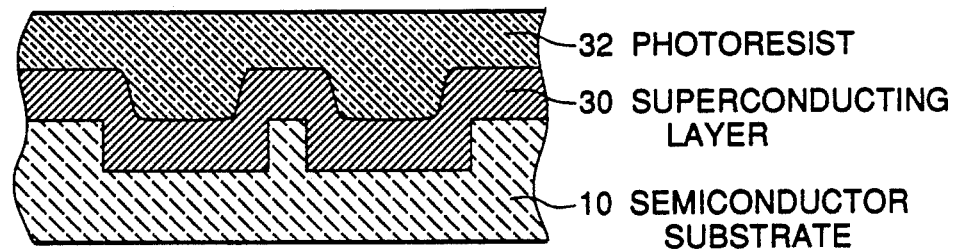

A superconducting layer 30 of niobium having a thickness of 200 nm is deposited on a whole principal surface of the semiconductor substrate 10 by sputtering, as shown in FIG. 2B. Then, for example, positive type photoresist 32 is also coated to cover the whole of the principal surface of the semiconductor substrate 10, as shown in FIG. 2C.

Figure 2D:
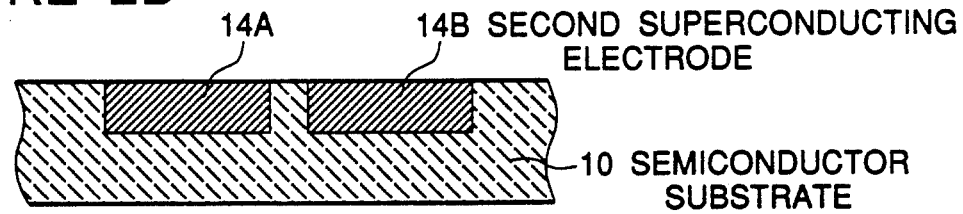

Thereafter, an etch-back processing is performed until the principal surface of the semiconductor substrate excluding the pair of trenches is exposed. As a result, as shown in FIG. 2D, there are formed the first and second superconductor electrodes 14A and 14B which are formed from the superconducting layer 30 and have the thickness of 200 nm and which are filled in the pair of trenches 12A and 12B and planarized to have a surface coplanar with the principal surface of the semiconductor substrate 10. In this etch-back process, the photoresist layer 32 is completely removed. A space between the first and second superconductor electrodes 14A and 14B becomes 0.1 μm.

Figure 2E:
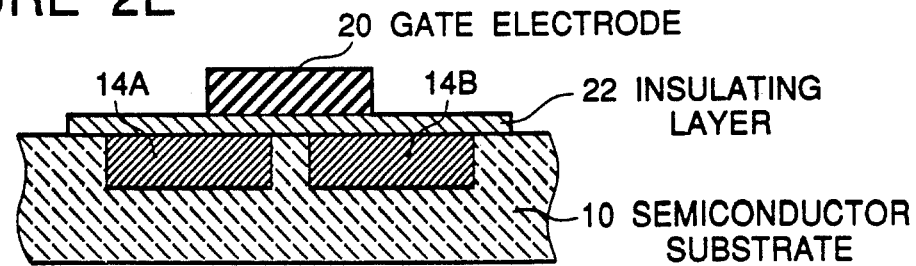

Furthermore, an insulating layer 22 formed of silicon dioxide having a thickness of 10 nm is deposited by a CVD process on a region including a region between the first and second superconductor electrodes 14A and 14B, and then, a gate electrode 20 of aluminum is formed on an region of the insulating layer 22 including a region between the first and second superconductor electrodes 14A and 14B, as shown in FIG. 2E.

In the above mentioned embodiment, the superconducting layer has formed of niobium and the semiconductor substrate has been formed silicon. However, the superconducting layer and the semiconductor substrate are in no way limited to these materials. For example, the superconducting layer can be formed of lead, niobium nitride, yttrium type superconductor material, barium type superconductor material, thallium type superconductor material, or others. The semiconductor substrate can be formed of InAs, InGaAs, Ge, or other semiconductor materials.

As seen from the above detailed description of the embodiment, the superconducting device in accordance with the present invention is characterized in that the gate electrode and the region of the semiconductor substrate sandwiched between the pair of superconducting electrodes and selectively brought either into a superconducting condition or into a non-superconducting condition are very simple in comparison with the conventional one and can be formed in the planar structure without necessity of the fine patterning technology required in a process for manufacturing the conventional superconducting device. In addition, the method in accordance with the present invention for manufacturing the superconducting device does not require a fine patterning technology which is difficult to improve the process tolerance. Therefore, the superconductor device can be manufactured with an enlarged process tolerance.

The invention has thus been shown and described with reference to the specific embodiments. However, it should be noted that the present invention is in no way limited to the details of the illustrated structures but changes and modifications may be made within the scope of the appended claims.

I claim:

1. A superconducting device comprising:
   a semiconductor substrate,
   first and second trenches formed on a principal surface of said semiconductor substrate separated from each other,
   first and second superconductor electrodes filled in said first and second trenches, said first and second superconductor electrodes being planarized to have a surface coplanar with said principal surface of said semiconductor substrate, said first and second superconductor electrodes forming a channel region which is formed by said semiconductor substrate at said principal surface of said semiconductor substrate and which is defined by opposing sides of said first and second superconductor electrodes and which has a length corresponding to a distance between opposing upper side edges of said first and second trenches,
   a gate insulator film formed directly on a planar surface which is formed of said principal surface of said semiconductor substrate and said surface of each of said first and second superconductor electrodes, said gate insulator film covering said channel region and at least a portion of each of said first and second superconductor electrodes adjacent to said channel region, and
   a gate electrode formed on a portion of said gate insulator film so as to extend over said channel region and at least a portion of each of said first and second superconductor electrodes, so as to control a carrier concentration in said channel region.

2. A superconducting device as claimed in claim 1 wherein each of said first and second superconductor electrodes has a thickness of 0.2 μm.

3. A superconducting device as claimed in claim 1 wherein each of said first and second superconductor electrodes are separated from each other by a distance of about 0.1 μm.

4. A superconducting device as claimed in claim 1 wherein each of said first and second superconductor electrodes is formed of a material selected from the group consisting of niobium, lead, niobium nitride, yttrium type superconductor material, barium type superconductor material, and thallium type superconductor material.

5. A superconducting device as claimed in claim 1 wherein the semiconductor substrate is formed of a material selected from a group consisting of silicon, InAs, InGaAs, and Ge.

* * * * *